(12) United States Patent
Schmidhammer et al.

(10) Patent No.: US 7,102,460 B2
(45) Date of Patent: Sep. 5, 2006

(54) DUPLEXER WITH EXTENDED FUNCTIONALITY

(75) Inventors: Edgar Schmidhammer, Stein (DE); Pasi Tikka, Taufkirchen (DE)

(73) Assignee: Epcos AG, (DE)

( * ) Notice: Subject to any disclaimer, the term of this patent is extended or adjusted under 35 U.S.C. 154(b) by 24 days.

(21) Appl. No.: 10/826,089

(22) Filed: Apr. 16, 2004

(65) Prior Publication Data
US 2004/0257172 A1 Dec. 23, 2004

(30) Foreign Application Priority Data
Apr. 17, 2003 (DE) .............................. 103 17 969

(51) Int. Cl.
*H03H 9/70* (2006.01)
*H03H 9/72* (2006.01)
(52) U.S. Cl. ..................... 333/133; 333/193; 333/189
(58) Field of Classification Search ................ 333/133, 333/193, 195
See application file for complete search history.

(56) References Cited

U.S. PATENT DOCUMENTS

| | | | | |
|---|---|---|---|---|
| 3,868,608 | A * | 2/1975 | Williams | ..................... 333/193 |
| 5,692,279 | A * | 12/1997 | Mang et al. | ................ 29/25.35 |
| 5,892,418 | A * | 4/1999 | Onishi et al. | ................ 333/193 |
| 5,910,756 | A * | 6/1999 | Ella | ............. 333/133 |
| 6,081,171 | A * | 6/2000 | Ella | ............. 333/189 |
| 6,483,402 | B1 * | 11/2002 | Endoh et al. | ................ 333/193 |
| 6,489,861 | B1 * | 12/2002 | Noguchi et al. | ............ 333/133 |
| 6,535,077 | B1 * | 3/2003 | Hiroshima et al. | ........... 333/26 |
| 6,670,866 | B1 * | 12/2003 | Ella et al. | .................... 333/133 |
| 6,714,099 | B1 * | 3/2004 | Hikita et al. | ................. 333/133 |
| 6,759,928 | B1 * | 7/2004 | Endou et al. | ................ 333/193 |
| 6,771,149 | B1 * | 8/2004 | Hiroshima et al. | ......... 333/206 |
| 2001/0013815 | A1 * | 8/2001 | Sawada | ....................... 333/133 |
| 2002/0140520 | A1 * | 10/2002 | Hikita et al. | ................. 333/133 |
| 2002/0144280 | A1 | 10/2002 | Matsuura | ..................... 725/105 |
| 2003/0060170 | A1 | 3/2003 | Tikka et al. | ................... 455/73 |
| 2003/0128081 | A1 * | 7/2003 | Ella et al. | ................... 333/133 |
| 2003/0169129 | A1 * | 9/2003 | Takamine | .................... 333/195 |
| 2003/0179053 | A1 * | 9/2003 | Aigner et al. | ............... 333/189 |
| 2003/0214369 | A1 * | 11/2003 | Kearns | ........................ 333/133 |

(Continued)

FOREIGN PATENT DOCUMENTS

JP 6-6170 * 1/1994 ................. 333/193

(Continued)

OTHER PUBLICATIONS

"A Design of Antenna Duplexer Using Ladder Type SAW Filters," Ikata et al., 1988 IEEE Ultrasonics Symposium, pp. 1-4.

(Continued)

*Primary Examiner*—Barbara Summons
(74) *Attorney, Agent, or Firm*—Schiff Hardin LLP

(57) ABSTRACT

A duplexer has an asymmetrical antenna port and a symmetrical reception output, and therefore can be interconnected (without any intermediate stages) to an amplifier with a differential input. A reception bandpass filter is arranged in the reception path of the duplexer. The reception bandpass filter can have the functionality of a balun. The transmission input of the duplexer can be designed symmetrically, in which case a transmission bandpass filter arranged in the transmission path should be designed symmetrically on the input side. The impedance of the antenna port of the duplexer can differ from the impedance of the reception output or the transmission input. No intermediate stages (such as a balun or—in cases of impedances that differ between the duplexer and its corresponding amplifier—an impedance transformer) are required between the duplexer and the amplifier that is interconnected (whether before or after) in the transmission or reception path.

27 Claims, 6 Drawing Sheets

U.S. PATENT DOCUMENTS

2004/0140868 A1* 7/2004 Takeuchi et al. ............ 333/189

FOREIGN PATENT DOCUMENTS

JP   2001-292050   * 10/2001

OTHER PUBLICATIONS

"SAW Antenna Duplexer Module Using SAW-Resonator-Coupled Filter for PCN System," Shibagaki et al., 1998 IEEE Ultrasonics Symposium, pp. 13-16.

* cited by examiner

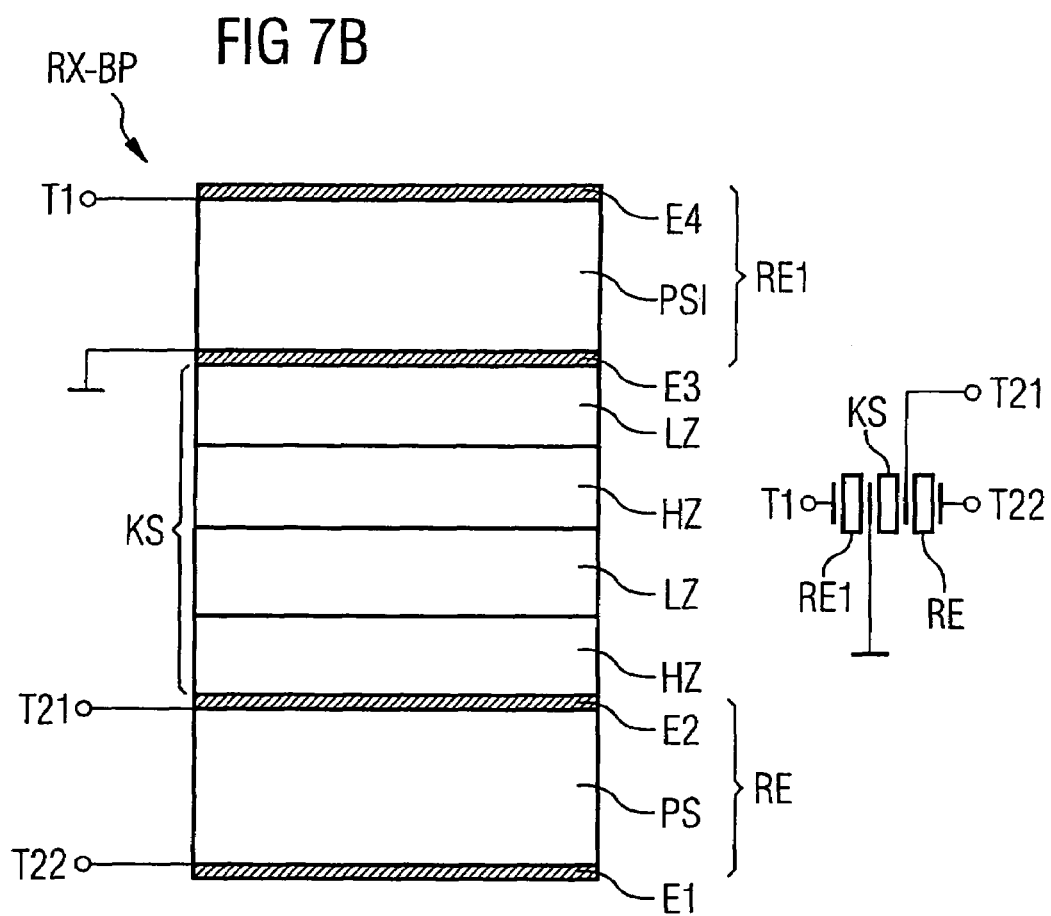

DUPLEXER WITH EXTENDED FUNCTIONALITY

BACKGROUND OF THE INVENTION

1. Field of the Invention

This invention relates to a duplexer.

2. Description of the Prior Art

A duplexer serves the purpose of separating the transmitted and received signals in the frequency band of a communication system, such as in a mobile radio telephone standard that uses a frequency division duplex operation or a mixed frequency division/time division duplex operation. The frequency band of the communication system is divided into a transmission band and a reception band. A duplexer should ensure a lower insertion attenuation in the relevant passband, as well as a high insulation of the reception and transmission paths, i.e., a high suppression of a signal to be transmitted in one direction in the passband of the signal to be transmitted in the opposite direction.

FIG. 1a schematically shows a known duplexer that has an antenna port ANT, a transmission input TX-IN and a reception output RX-OUT. The transmission input TX-IN can be connected to a power amplifier PA and the reception output RX-OUT can be connected to a low noise amplifier LNA. A transmission TX is arranged between the antenna port ANT and the transmission input TX-IN. A bandpass filter is arranged in each signal path (reception bandpass filter RX-BP in the reception path RX and a transmission bandpass filter TX-BP in the transmission path TX). All ports of the duplexer, i.e., ANT, TX-IN, and RX-OUT, are designed asymmetrically.

In addition, the publication United States Publication No. 2003/0060170 discloses a duplexer schematically illustrated in FIG. 1b, in which all ports are designed symmetrically.

It is known to arrange an adapter network between the antenna port and the bandpass filter TX-BP and/or RX-BP. In addition, an adapter network or an impedance transformer can be used at an intermediate stage to adapt the impedance of the transmission input TX-IN and the power amplifier and/or to adapt the impedance of the reception output RX-OUT and the low noise amplifier.

As used herein, "impedance transformer," means a circuit arrangement that performs a transformation (matching) of the output impedance of the first stage into the input impedance of a post-connected second stage, wherein these impedances differ from each other significantly, by at least a factor of 2. A smaller impedance adaptation between the stages of a circuit arrangement can be performed using an adapter network.

Another known design is the use of a balun between a reception bandpass filter and the low-noise amplifier to balance the reception signal. By contrast, the output of a performance amplifier is usually designed asymmetrically.

The circuit elements that are pre-connected and post-connected in relation to the duplexer form an interface to the duplexer, at which point, in the case of a sudden impedance jump, a portion of the energy of the signal is reflected, which is why an additional impedance adaptation of the stages is often required, and which results in signal losses at the adaptation elements.

SUMMARY OF THE INVENTION

An object of the invention is to provide a duplexer with an extended functionality and especially one that can be interconnected, without any intermediate stages, with a low-noise amplifier, a power amplifier or a chip set comprising such amplifiers.

The above object is achieved in accordance with the invention by a duplexer for the separation of transmitted and received signals of a defined frequency band, having an asymmetrically designed antenna port, a reception output, and a transmission input. A reception path exists between the antenna port and the reception output of the duplexer. A transmission path exists between the antenna port and the transmission input. The duplexer has a reception bandpass filter, which is interconnected with the transmission path. Either the reception output of the duplexer or both the reception output and the transmission input are designed symmetrically.

It is also possible for the reception bandpass filter (or the transmission bandpass filter) to have an asymmetrical output (or input in case of the transmission bandpass filter) and for it to be interconnected with a balun that is integrated in the duplexer, while the balun's symmetrical side is connected to the symmetrically designed reception output (or transmission input).

In an embodiment of the invention, the reception bandpass filter (or transmission bandpass filter) is asymmetrical on the antenna side and is symmetrically designed on the other side, which is connected to the reception output (or transmission input).

In another embodiment of the invention, the impedance of the antenna port can be different from the impedance of the reception output and/or of the transmission input, and the impedances would differ from each other, for example, by at least a factor of 2. An impedance transformer can be arranged in the relevant signal path on the antenna side or, alternatively, on the opposite side (after the reception bandpass filter or the transmission bandpass filter).

In another embodiment of the invention, the functionality of the impedance transformer can be implemented in the relevant bandpass filter, with the input impedance of the transmission bandpass filter and/or of the reception bandpass filter differing from its output impedance, and being adapted to the desired impedance level on the ports of the duplexer.

Unlike current duplexers, a duplexer according to the invention has the advantage that no intermediate stage, such as a balun or—in the case of impedances that differ between the duplexer and the corresponding amplifier—an impedance transformer, is required between the duplexer and the power amplifier that is pre-connected in the transmission path or the low-noise amplifier that is post-connected in the reception path.

The bandpass filters can contain a transducer operating with surface acoustic waves, a resonator (thin-layer resonator) operating with bulk acoustic waves, a microwave ceramic resonator, an LC resonator or any combination of these components.

The bandpass filters preferably are arranged on a substrate made of ceramic or laminate material, where parts of the bandpass filters or other passive circuit elements can be hidden in the substrate.

Preferably, the insulation between the transmission path and the reception path of the duplexer should be greater than 40 dB.

DESCRIPTION OF THE DRAWINGS

FIGS. 7a and 7b schematically show in sections, a reception bandpass filter arranged in the reception path of the duplexer, where the bandpass filter is designed as a stack of thin-layer resonators. FIG. 7b shows an asymmetrical-symmetrical (balanced-unbalanced) circuit of thin-layer resonators arranged in a stack and acoustically connected with one another (left), as well as an equivalent circuit (right).

DESCRIPTION OF THE PREFERRED EMBODIMENTS

Figure 1A:
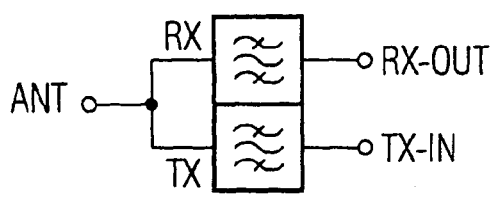
FIG. 1a schematically illustrates a known duplexer with asymmetrical ports.
Figure 1B:
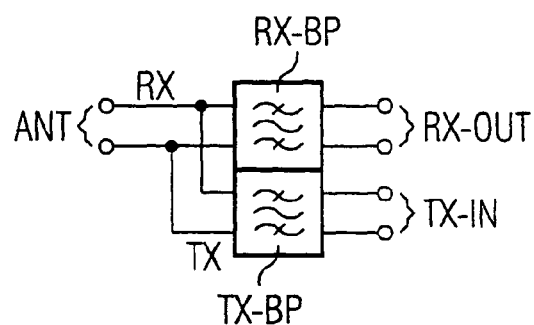
FIG. 1b schematically illustrates a known duplexer with symmetrical ports.
Figure 2:
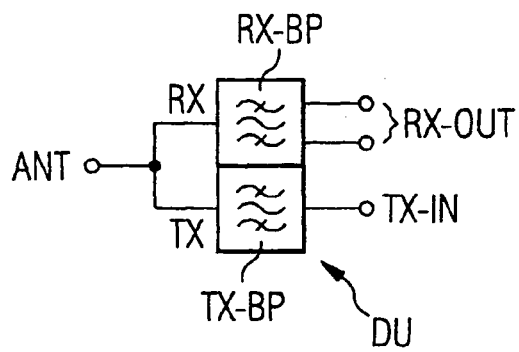
FIG. 2 schematically illustrates a duplexer according to the invention with an asymmetrical transmission input.

FIG. 2 shows a first variant of the duplexer DU according to the invention with an asymmetrically designed transmission input TX-IN. The duplexer has an asymmetrically designed antenna port ANT as well as parallel signal paths RX (reception path) and TX (transmission path), which are either directly connected at one end to the antenna port ANT or indirectly, through an adaptation circuit not illustrated here, and, at the opposite end, to another port (reception output RX-OUT of the reception path, the transmission input TX-In of the transmission path). A transmission bandpass filter TX-BP is arranged in the transmission path TX, and a reception bandpass filter is arranged in the reception path RX.

In this variant, the transmission input TX-IN is designed asymmetrically.

The reception output RX-out is designed symmetrically. The reception bandpass filter RX-BP is asymmetrical at the input (on the antenna's side), and symmetrical on the output side, and thus has a balun functionality integrated with the filter.

The input of the transmission bandpass filter TX-BP as well as the output of the reception bandpass filter RX-BP are here directly connected to the corresponding port TX-IN or RX-OUT. It is also possible to arrange an additional circuit (e.g., an adapter network, impedance transformer, or a balun) between the output of the reception bandpass filter RX-BP and the reception output RX-OUT and/or between the transmission input TX-IN and the input of the transmission bandpass filter.

Figure 3:
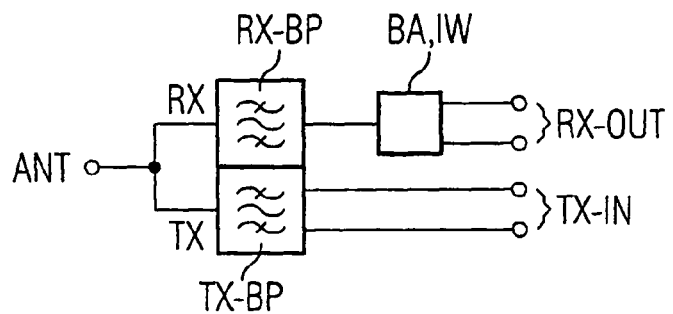
FIG. 3 schematically illustrates another embodiment of a duplexer according to the invention with asymmetrical transmission input.

FIG. 3 shows an embodiment of the invention in which a circuit is interconnected between the reception bandpass filter RX-BP and the reception output RX-OUT. This circuit comprises a balun BA to balance the reception signal and an impedance transformer IW to adapt the output impedance of the reception bandpass filter RX-BP to the impedance of the subsequent stage. The output of the reception bandpass filter RX-BP is here designed asymmetrically.

In this embodiment, the transmission input TX-IN is designed symmetrically, and the input of the transmission bandpass filter TX-BP also has a symmetrical design. However, it is also possible to use a transmission bandpass filter TX-BP with an asymmetrical input, and to interconnect a balun between this input and the transmission input TX-IN.

Figure 4A:
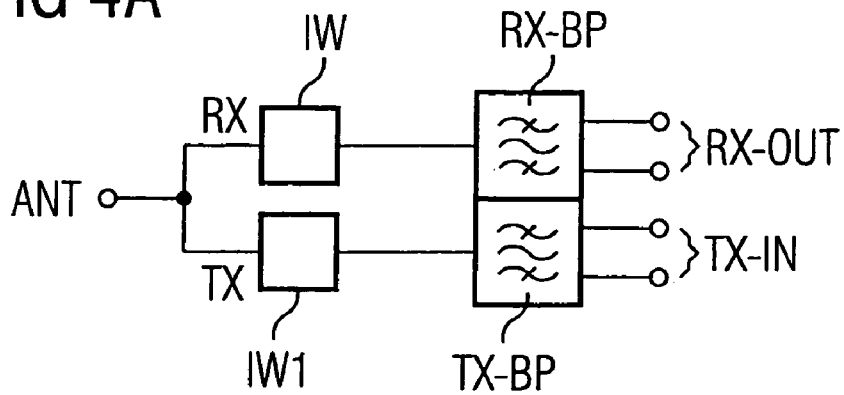
FIGS. 4a, 4b, 4c respectively show further embodiments of a duplexer according to the invention, with one impedance transformer in the transmission path and one in the reception path.
Figure 4B:
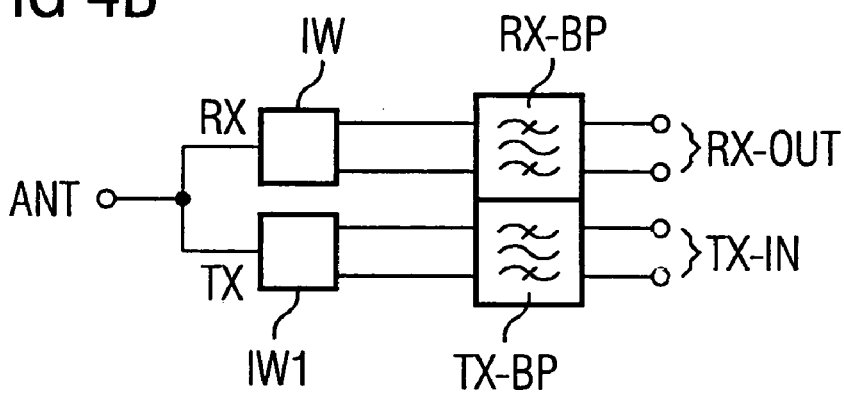

FIGS. 4a and 4b present the option to arrange an impedance transformer IW in the reception path RX or to arrange an impedance transformer IW1 in the transmission path TX. In both cases, the transformers are arranged on the antenna's end. FIG. 4a shows the impedance transformers IW and IW1 that are designed with an asymmetrical input and an asymmetrical output. The filters TX-BP and RX-BP are designed with an asymmetrical input and a symmetrical output.

FIG. 4b represents another variant of the invention, where the filters TX-BP and RX-BP are designed with a symmetrical input and a symmetrical output. The impedance transformers IW and IW1 have a balun functionality with an asymmetrical input and a symmetrical output.

Figure 4C:
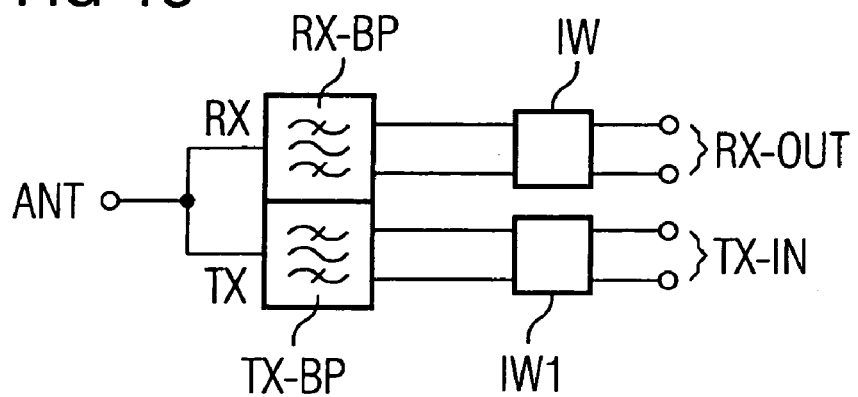

The embodiment shown in FIG. 4c has impedance transformers IW and IW1 in the paths RX and TX on the output side that have a symmetrical input and output. The filters TX-BP and RX-BP are designed as previously explained in FIG. 4a.

Figure 5:
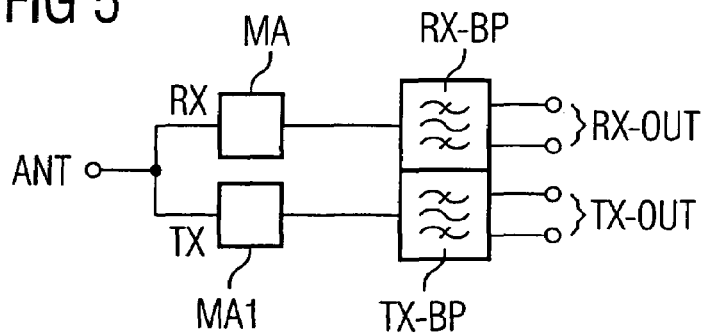
FIG. 5 schematically illustrates another embodiment of a duplexer designed according to the invention, with an adapter network in the transmission and reception paths.

Instead of the impedance transformers IW and IW1, the signal path can comprise a different circuit, such as the adapter networks MA and MA1 shown in FIG. 5.

Figure 6:
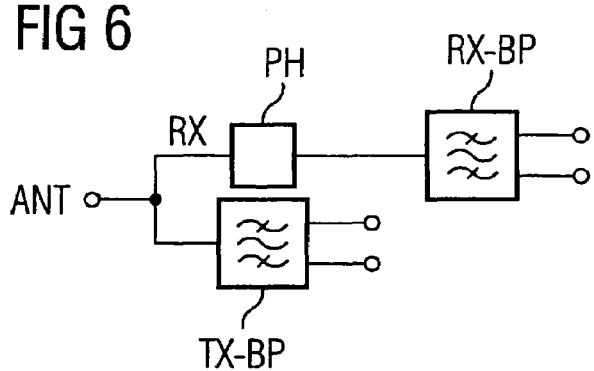
FIG. 6 schematically illustrates a duplexer according to the invention with a phase advancer.

FIG. 6 shows a phase advancer arranged in the reception path RX. Alternatively, the phase advancer can be arranged in the transmission path TX or in both paths.

In a preferred embodiment, the adapter network MA or the phase advancer PH arranged in the reception path RX can function as an adapted (to the phase shift by 180° in the Smith diagram) transformation line (preferably a l/4 line), which ensures an open window at the input of the reception bandpass filter RX-BP in the passband of the bandpass filter TX-BP.

Figure 7A:
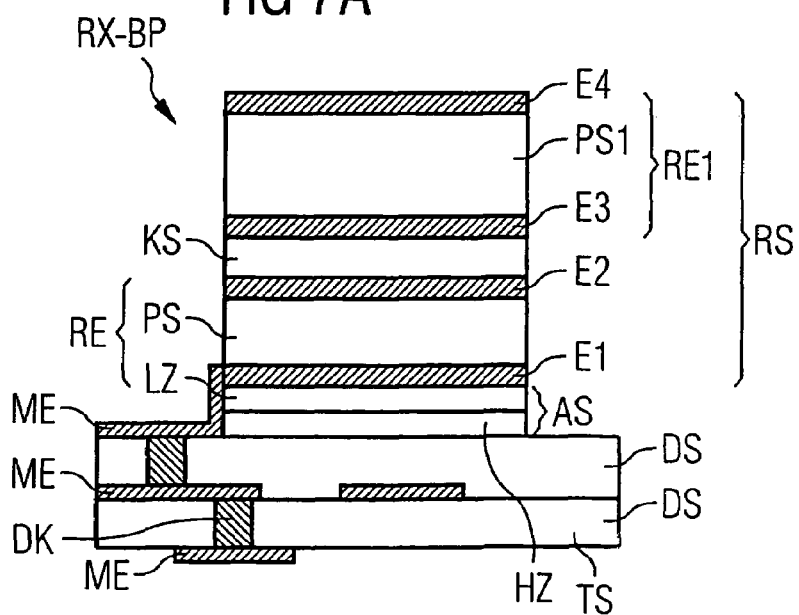

FIG. 7a shows, schematically and in sections, a reception bandpass filter RX-BP arranged in the reception path of the duplexer. The filter is designed as a stack RS of thin-layer resonators RE and RE1. The resonator RE consists of two electrodes E1 and E2 and a piezoelectric layer PS arranged in between the two. Analogously, the resonator RE1 is built using electrodes E3 and E4 and the piezoelectric layer PS1. The thin-layer resonators RE and RE1 are acoustically connected through the coupling layer system KS. The resonators RE and RE1 and the coupling layer system KS together form the resonator stack RS. The resonator stack is arranged on a substrate TS and an acoustic mirror AS is provided between the substrate TS and the resonator stack RS. This mirror prevents the escape of the acoustic wave in the direction of the substrate. The acoustic mirror AS comprises a layer LZ with a lower acoustic impedance and a layer HZ with a higher acoustic impedance.

The coupling layer system KS is usually a partially permeable acoustic mirror and can consist of one or more layers. FIG. 7b indicates that the coupling layer system KS can consist of a sequence of layers LZ, HZ with a lower or higher acoustic impedance.

The substrate TS has one or more dielectric layers DS with metallized layers ME arranged on, underneath and (in cases with several layers) between the dielectric layers. The metallization layers ME are connected with each other through interlayer connections DK, and also with the component structures arranged on the upper side of the substrate (such as resonators or filters and the plate of the end device) through interlayer connections DK, connection lines, and electric connectors. The metallization levels ME can comprise, at least partially, adapter elements, bandpass filter TX-BP and RX-Bp as well as other circuit elements (e.g., inductances, capacitances, line sections).

FIG. 7b shows, on the left side, an exemplary asymmetrical-symmetrical (balanced-unbalanced) circuit (balanced-unbalanced—balun circuit) of the stacked resonators RE1 and RE. A corresponding equivalent circuit is shown on the right-hand side. The resonator RE1 is connected to an asymmetrical port with a signal-conducting line and a connector T1 assigned to this line. The resonator RE is connected to a symmetrical port with two signal-conducting lines and connectors T21 and T22 assigned to these lines. The resulting circuited reception bandpass filter RX-BP implements a balun functionality of the duplexer in the reception path. According to the invention, the integration of the balun functionality in the reception bandpass filter RX-BP allows one to spare a balun in the reception path of the end device that would have to be designed as a discrete balun included in the circuit after the duplexer.

Figure 7C:
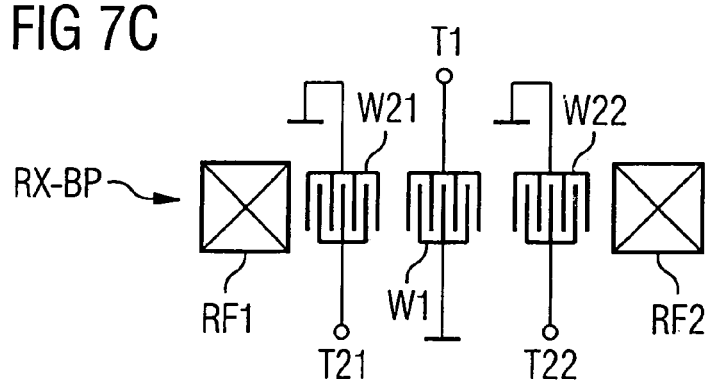
FIGS. 7c, 7d schematically show in sections, a reception bandpass filter arranged in the reception path of the duplexer. The reception bandpass filter comprises transformers working with surface acoustic waves that are acoustically connected with each other.

FIG. 7c shows, in sections, an equivalent circuit of another advantageous variant of the invention with a reception bandpass filter RX-Bp designed with SAW (surface acoustic wave) technology, which has an integrated balun functionality. The electric connector T1 is assigned to the asymmetrical port, preferably to an input port of the bandpass filter, and is connected to a first transformer W1 (input transformer). The transformer W1 is acoustically coupled to the transformers W21 and W22 (output transformers). The transformers W1, W21, and W22 are interdigital transformers that work with surface acoustic waves.

The transformers W1, W21, and W22 are arranged in an acoustic track defined by reflectors RF1 and RF2. The input transformer W1 is located between the output transformers W21 and W22.

The output transformer W21 is connected between the ground and the electric connector T21 of a symmetrically designed port (output port). The output transformer W22 is connected between the ground and the electric connector T22 of the same port.

Figure 7D:
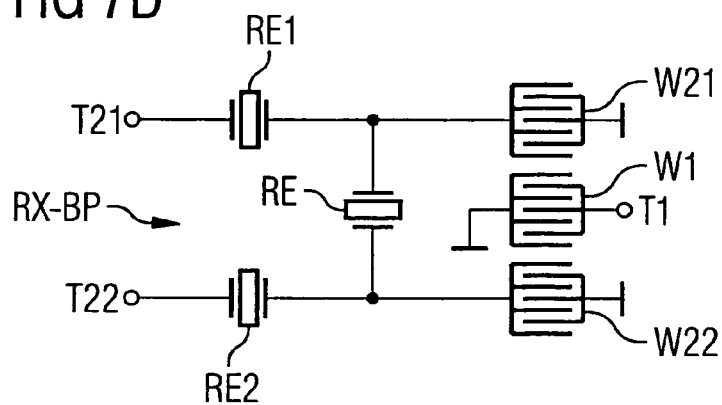

FIG. 7d shows an embodiment of the circuitry already explained in FIG. 7c, where the live connectors of the output transformers W21 and W22 are indirectly connected to the connectors T21 and T22 through a post-connected structure. The post-connected structure is the basic element of the known ladder-type arrangement that is suitable for a symmetrical conductance of the signal.

The live connectors of the output transformers W21 and W22 are connected to the corresponding connectors T21 and T22 of the symmetrical port through a signal-conducting line. An in-series resonator (RE1 or RE2) is interconnected in each signal line. The two signal lines are connected with each other through a parallel branch and a parallel resonator Re arranged therein. The parallel resonator RE is designed as a SAW (surface acoustic wave) two-terminal resonator or as an FBAR (thin film bulk acoustic wave) resonator.

Figure 8:
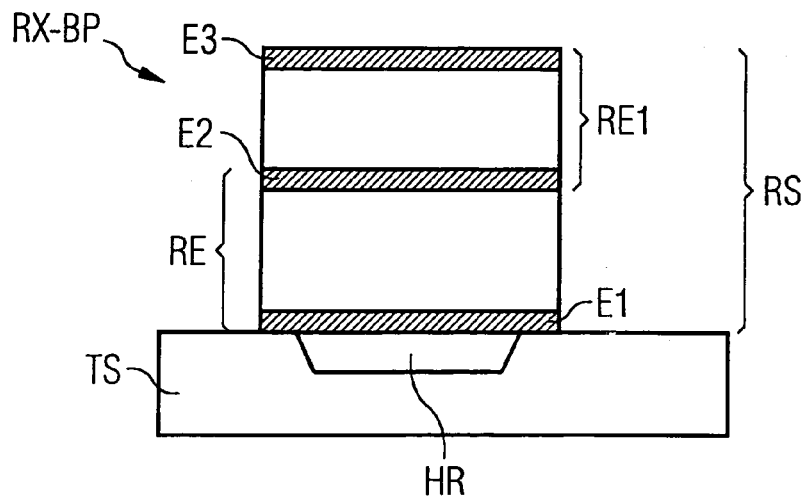
FIG. 8 schematically shows in sections, a reception bandpass filter arranged in the reception path of the duplexer, where the reception bandpass filter is designed as a stack of thin-layer resonators that are acoustically and electrically connected with each other.

FIG. 8 shows an embodiment of the reception bandpass filter RX-BP. The resonator stack RS consists of the resonators RE and RE1, which are superimposed on each other and which share a common electrode E2. The resonator stack RS is arranged in membrane technology over a hollow space HR designed in the substrate TS.

Figure 9A:
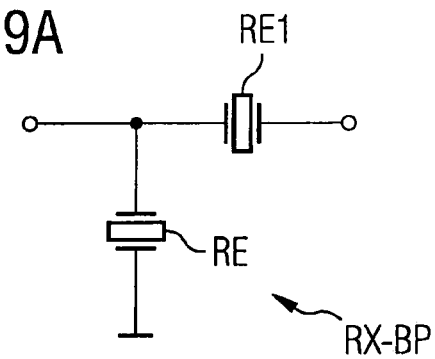
FIG. 9a schematically shows in sections, a basic element of the reception bandpass filter designed in a ladder-type arrangement.
Figure 9B:
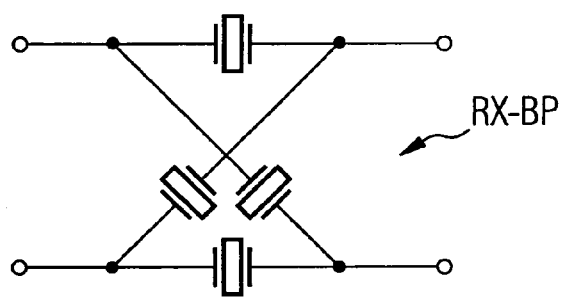
FIG. 9b schematically shows in sections, a basic element of the reception bandpass filter designed in a lattice-type arrangement.

FIGS. 9a and 9b show an exemplary connection of resonators as basic elements of a ladder-type arrangement (FIG. 9a) and a lattice-type arrangement (FIG. 9b). The basic elements can be combined with other basic elements that have been designed in a similar or different manner, and together they form a bandpass filter, shown here in sections as the reception bandpass filter RX-BP. Acoustic transformers can also be used instead of the resonators.

Figure 10:
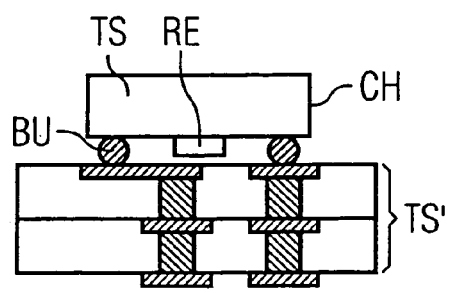
FIG. 10 shows, in a schematic cross-section, a duplexer according to the invention as a component in a flip chip arrangement.

FIG. 10 shows the schematic cross-section of an exemplary structure of a duplexer according to the invention designed in the flip chip arrangement. In this variant of the invention, a chip CH—which carries component structures, such as the resonator RE or bandpass filters RX-BP and TX-BP that are placed on the substrate TS—is arranged on another substrate TS', and is electrically and mechanically connected with it through bumps BU.

Figure 11:
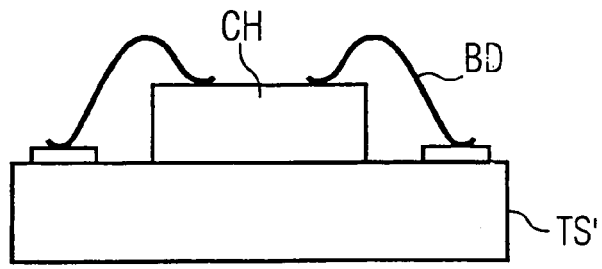
FIG. 11 shows, in a schematic cross-section, a duplexer according to the invention as a component with electrical connections in the form of bond wires.

FIG. 11 shows the additional option of electrically connecting the chip CH that is mounted on a substrate TS' by means of bond wires BD.

The duplexer can form a part of a modularly designed component, for example, of a front-end module.

Besides the embodiments of the invention presented in the design examples and their corresponding figures, a number of other combinations are possible, and these could be obtained by excluding individual components or by combining individual components of the described design examples. Elements designed as layers or structured layers can also have a multiple-layer design.

Although further modifications and changes may be suggested by those skilled in the art, it is the intention of the inventors to embody within the patent warranted hereon all changes and modifications as reasonably and properly come within the scope of their contribution to the art.

We claim as our invention:

1. A duplexer for separating transmitted and received signals of a defined frequency band comprising:
   an antenna port, a reception output, and a transmission input;
   a reception path connected between said antenna port and said reception output;
   a transmission path connected between said antenna port and said transmission input;
   a reception bandpass filter connected in said reception path and comprised of a first partial filter and a second partial filter;
   said first partial filter comprising a reactance filter selected from the group consisting of a ladder-type reactance filter and a lattice-type reactance filter, said reactance filter comprising a plurality of bulk acoustic wave resonators;
   said second partial filter being a balun having an acoustic track proceeding in a longitudinal direction, said acoustic track comprising a plurality of surface acoustic wave transducers that are acoustically coupled to each other in said longitudinal direction;

a transmission bandpass filter connected in said transmission path; and said antenna port being asymmetrical and said reception output being symmetrical.

2. A duplexer as claimed in claim 1 wherein said first partial filter has an asymmetrical output, and said second partial filter is connected between said first partial filter and said reception output.

3. A duplexer as claimed in claim 1 wherein said transmission input is asymmetrical.

4. A duplexer as claimed in claim 1 wherein said transmission input is symmetrical.

5. A duplexer as claimed in claim 4 wherein said transmission bandpass filter has a symmetrical input.

6. A duplexer as claimed in claim 4 wherein said transmission bandpass filter has an asymmetrical input, and comprising a balun connected between said transmission bandpass filter and said transmission input.

7. A duplexer as claimed in claim 1 wherein said antenna port has an impedance that is different from an impedance of at least one of said reception output and said transmission input.

8. A duplexer as claimed in claim 1 wherein an input impedance of at least one of said transmission bandpass filter and said reception bandpass filter is different from an output impedance thereof.

9. A duplexer as claimed in claim 8 wherein said input and output impedance differ by at least a factor of two.

10. A duplexer as claimed in claim 1 wherein at least one of said transmission bandpass filter and said reception bandpass filter comprises a component selected from the group consisting of a surface acoustic wave transducer, a microwave ceramic resonator and an LC resonator.

11. A duplexer as claimed in claim 1 wherein at least one of said transmission bandpass filter and said reception bandpass filter comprises a bulk acoustic wave resonator.

12. A duplexer as claimed in claim 1 comprising a substrate at which said antenna port, said reception output, said transmission input, said reception path, said transmission path, said reception bandpass filter and said transmission bandpass filter are disposed, said substrate comprising at least one dielectric layer and at least one metallized layer disposed adjacent to said dielectric layer.

13. A duplexer as claimed in claim 12 comprising an adapter network connected in at least one of said reception path and said transmission path at a side of said antenna port.

14. A duplexer as claimed in claim 13 wherein said adapted network is connected in said reception path, and comprises an adapted transformation line.

15. A duplexer as claimed in claim 13 wherein at least one of said transmission bandpass filter, said reception bandpass filter and said adapter network is formed by a portion of said metallization level of said substrate.

16. A duplexer as claimed in claim 13 wherein at least one of said transmission bandpass filter, said reception bandpass filter and said adapter network is a chip disposed on said substrate.

17. A duplexer as claimed in claim 16 wherein said chip is electrically connected to said substrate by an electrical connection selected from the group consisting of bond wires and solder bumps.

18. A duplexer as claimed in claim 12 wherein said dielectric layer of said substrate is composed of a material selected from the group consisting of ceramics and laminated materials.

19. A duplexer as claimed in claim 1 comprising an adapter network connected in at least one of said reception path and said transmission path, at a side of said antenna port.

20. A duplexer as claimed in claim 19 wherein said adapter network is disposed in said reception path, and comprises an adapted transformation line.

21. A duplexer as claimed in claim 1 comprising an impedance transformer connected in said reception path at a location selected from the group consisting of preceding said reception bandpass filter and after said reception bandpass filter.

22. A duplexer as claimed in claim 1 wherein at least one of said transmission bandpass filter and said reception bandpass filter comprises a plurality of bulk acoustic wave resonators superimposed on each other in a stack and coupled to each other by a coupling selected from the group consisting of acoustic couplings and electrical couplings, and wherein each of said bulk acoustic wave resonators comprises a piezoelectric layer disposed between two electrodes.

23. A duplexer as claimed in claim 22 wherein bulk acoustic wave resonators that are adjacent to each other in said stack share a common electrode.

24. A duplexer as claimed in claim 1 further comprising an isolation between said transmission path and said reception path for producing a separation greater than 40 dB between said transmission path and said reception path.

25. A duplexer as claimed in claim 1 comprising a phase shifter connected in said transmission path between said antenna port and said transmission bandpass filter for separating transmitted and received signals at said antenna port into said transmission path and reception path, respectively.

26. A duplexer as claimed in claim 1 comprising a phase advancer connected in said reception path between said antenna port and said reception bandpass filter, for separating transmitted and received signals at said antenna port into said transmission path and said reception path, respectively.

27. A duplexer as claimed in claim 1 comprising an impedance transformer connected in said transmission path at a location selected from the group consisting of preceding said transmission bandpass filter and after said transmission bandpass filter.

* * * * *